(12) United States Patent
Taniuchi

(10) Patent No.: US 12,607,487 B2
(45) Date of Patent: Apr. 21, 2026

(54) PROXIMITY SENSOR, METHOD FOR SENSING PROXIMITY OF WIRELESS DEVICE AND BODY PART OF USER, AND WIRELESS DEVICE

(71) Applicant: GOERTEK INC., Weifang (CN)

(72) Inventor: Hirotada Taniuchi, Weifang (CN)

(73) Assignee: GOERTEK INC., Weifang (CN)

( * ) Notice: Subject to any disclaimer, the term of this patent is extended or adjusted under 35 U.S.C. 154(b) by 147 days.

(21) Appl. No.: 18/642,896

(22) Filed: Apr. 23, 2024

(65) Prior Publication Data

US 2024/0271966 A1      Aug. 15, 2024

Related U.S. Application Data

(63) Continuation of application No. PCT/CN2021/135344, filed on Dec. 3, 2021.

(51) Int. Cl.
*G01R 27/26*       (2006.01)
*G01D 5/24*        (2006.01)
*H01Q 1/24*        (2006.01)
*H03K 17/955*      (2006.01)

(52) U.S. Cl.
CPC .............. *G01D 5/24* (2013.01); *H01Q 1/243* (2013.01); *H03K 17/955* (2013.01)

(58) Field of Classification Search
CPC ... G01D 5/24; G01V 3/08; G01V 3/12; H03K 17/95; H03K 17/97; H03K 17/955; H03K 17/9512; H03K 17/9517; H01Q 1/243; H01Q 1/245; H04B 1/16; H04B 1/3838
See application file for complete search history.

(56) References Cited

U.S. PATENT DOCUMENTS

| | | | |
|---|---|---|---|
| 8,649,833 B1 * | 2/2014 | Lee | H04M 1/026 |
| | | | 455/82 |
| 9,867,139 B1 * | 1/2018 | Khasgiwala | H04B 17/318 |
| 2012/0214412 A1 * | 8/2012 | Schlub | H03K 17/955 |
| | | | 455/41.1 |

(Continued)

FOREIGN PATENT DOCUMENTS

| | | |
|---|---|---|
| CN | 1673937 A | 9/2005 |
| CN | 108512959 A | 9/2018 |

(Continued)

OTHER PUBLICATIONS

International Search Report and Written Opinion in Corresponding International Application No. PCT/CN2021/135344, mailed Aug. 10, 2022; 8 pgs.

*Primary Examiner* — Thang X Le

(74) *Attorney, Agent, or Firm* — HAUPTMAN HAM, LLP

(57) ABSTRACT

Disclosed are a proximity sensor, a method for sensing proximity of a wireless device to a body part of a user, and a wireless device. The proximity sensor includes an antenna electrode and detecting circuitry. The antenna electrode serves as at least a part of an antenna of the wireless device. The detecting circuitry is electrically coupled to the antenna electrode, and is configured to detect an electrical parameter of the antenna electrode and output an operating signal based on the electrical parameter. A distance between the antenna electrode and a body part of a user is determined based on the operating signal.

15 Claims, 9 Drawing Sheets

(56) References Cited

U.S. PATENT DOCUMENTS

| | | | | |
|---|---|---|---|---|
| 2014/0155000 A1* | 6/2014 | Erkens | ................. | H04W 52/18 |
| | | | | 455/73 |
| 2015/0200447 A1* | 7/2015 | Tang | ..................... | H01Q 1/243 |
| | | | | 343/720 |
| 2017/0090599 A1* | 3/2017 | Kuboyama | ............ | G04C 3/001 |
| 2018/0069549 A1 | 3/2018 | Cooper et al. | | |
| 2018/0233822 A1* | 8/2018 | Tang | ........................ | H01Q 1/48 |
| 2019/0312361 A1* | 10/2019 | Nakanishi | ............ | H04B 1/3838 |
| 2022/0345167 A1* | 10/2022 | Yang | ........................ | H04B 1/04 |
| 2023/0098109 A1* | 3/2023 | Rouaissia | ............. | H03K 17/95 |
| | | | | 324/207.14 |

FOREIGN PATENT DOCUMENTS

| | | |
|---|---|---|
| CN | 109643143 A | 4/2019 |
| WO | 2012112275 A1 | 8/2012 |

* cited by examiner

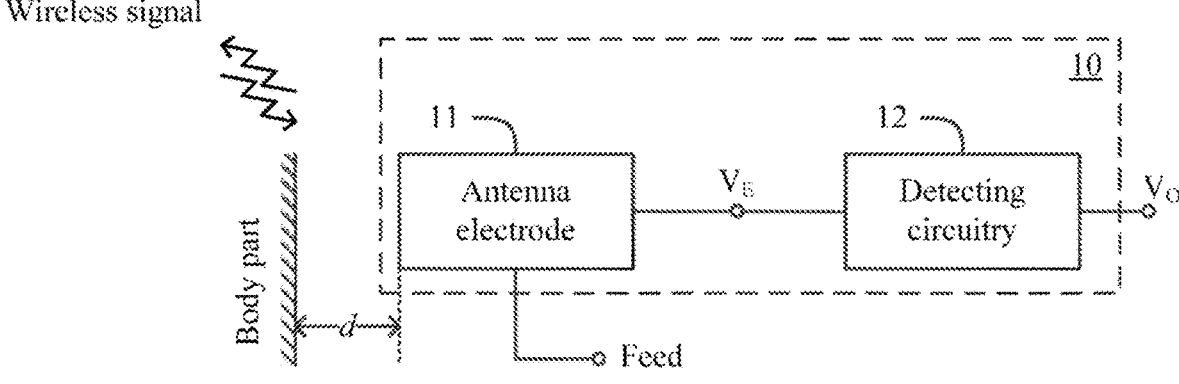
FIG. 1
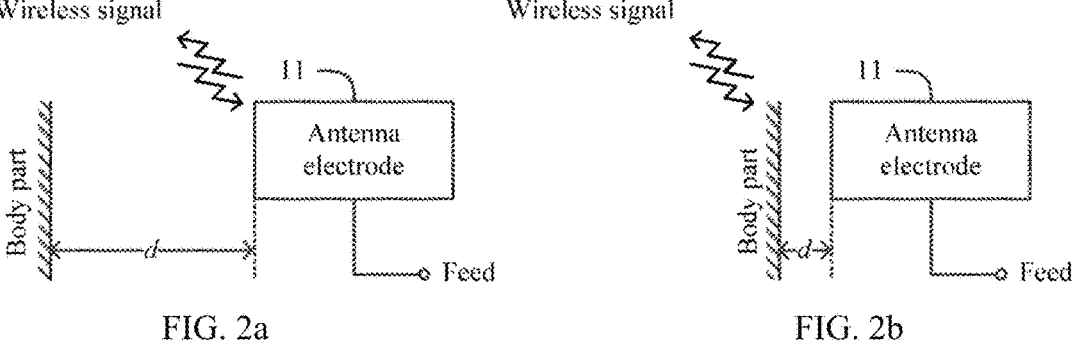
FIG. 2a                              FIG. 2b

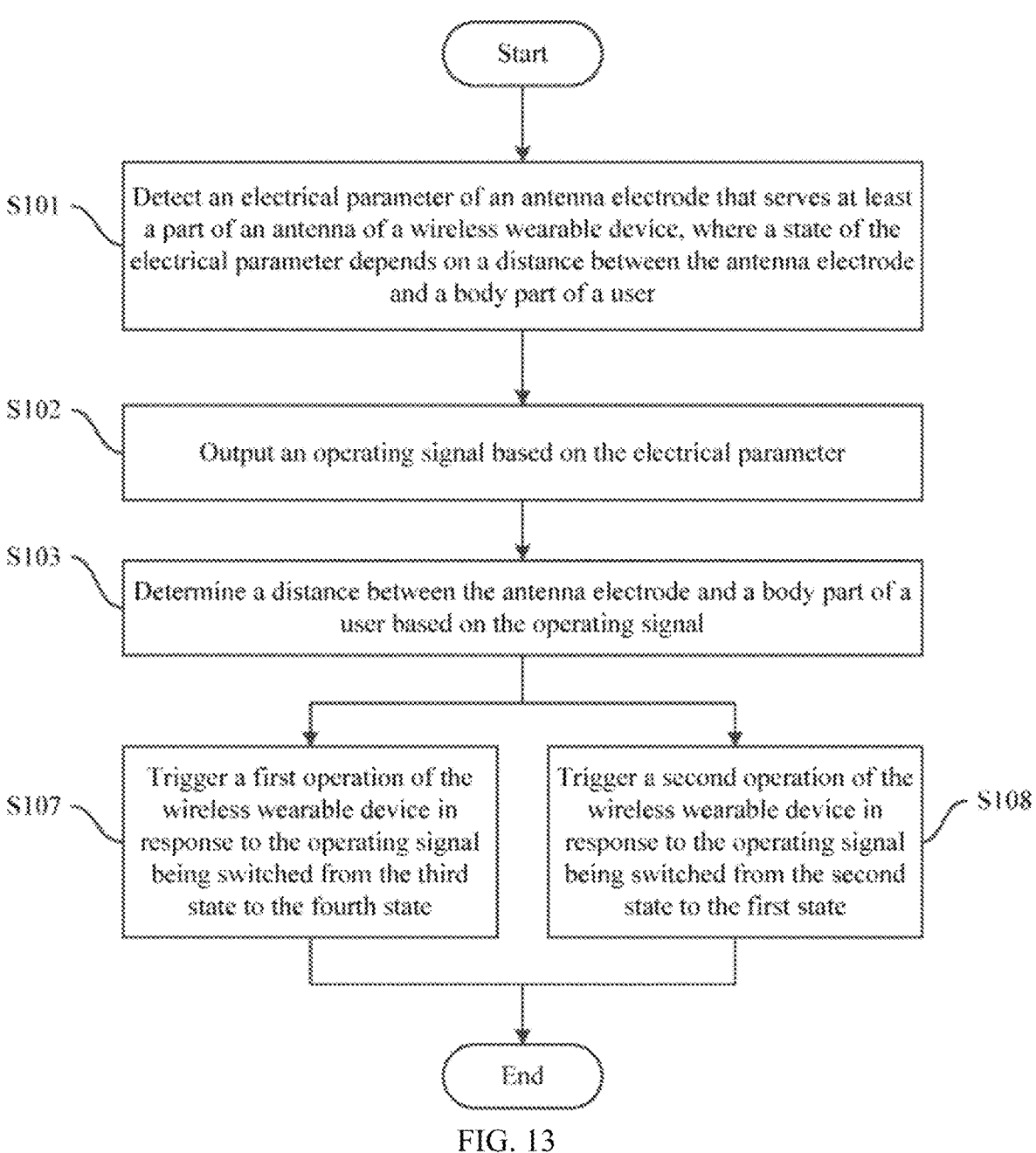

Start

S101 — Detect an electrical parameter of an antenna electrode that serves at least a part of an antenna of a wireless wearable device, where a state of the electrical parameter depends on a distance between the antenna electrode and a body part of a user S102 — Output an operating signal based on the electrical parameter S103 — Determine a distance between the antenna electrode and a body part of a user based on the operating signal S107 — Trigger a first operation of the wireless wearable device in response to the operating signal being switched from the third state to the fourth state S108 — Trigger a second operation of the wireless wearable device in response to the operating signal being switched from the second state to the first state End

FIG. 13

PROXIMITY SENSOR, METHOD FOR SENSING PROXIMITY OF WIRELESS DEVICE AND BODY PART OF USER, AND WIRELESS DEVICE

CROSS-REFERENCE TO RELATED APPLICATIONS

This application is a continuation application of International Application No. PCT/CN2021/135344, filed on Dec. 3, 2021, and the content of which is incorporated herein by reference in its entirety.

TECHNICAL FIELD

The present disclosure relates to the technical field of wireless communication, and in particular, to a wireless device.

BACKGROUND

Recent decades have witnessed prosperity of wireless communication technology. An increasing requirement on convenient "anytime and anywhere" accesses to the Internet and WLANs leads to a rapid development of electronic devices that are wireless and portable, such as mobile phones, tablets and handheld game consoles. Miniaturization of wireless devices is a trend in both research and business, which aims at merging the wireless communication into each application scenario in people's daily life. A prospect is that the wireless devices are light, so as to provide high-quality wireless accesses without putting a significant burden on users. Such objective demands wireless devices that are increasingly compact, and thereby raises great challenges on downscaling and re-usage of components, such as integrated circuits, detectors, batteries, and antennas.

SUMMARY

A proximity sensor, a method for sensing proximity of a wireless device to a body part of a user, and a wireless device are provided, in order to address at least an issue that a conventional proximity sensor hinders miniaturization and increases power consumption of a wireless device. Solutions of the present disclosure are summarized as follows.

In a first aspect, a proximity sensor applied to a wireless device is provided, including: an antenna electrode, serving as at least a part of an antenna of the wireless device; and detecting circuitry, electrically coupled to the antenna electrode, where the detecting circuitry is configured to detect an electrical parameter of the antenna electrode, and output an operating signal based on the electrical parameter; where a distance between the antenna electrode and a body part of a user is capable to be determined based on the operating signal.

In an embodiment, the body part serves as another part of the antenna, and a return loss of the antenna is decreased when the distance is decreased for wireless signals of at least one communication standard applicable to the wireless device.

In an embodiment, the antenna electrode is electrically coupled to radio frequency (RF) circuitry of the wireless device, and the RF circuitry is configured to transmit or receive wireless signals via the antenna.

In an embodiment, the RF circuitry and the detecting circuitry are located on a same print circuit board (PCB) of the wireless device.

In an embodiment, the electrical parameter reflects capacitance between the antenna electrode and a referential point, and the detecting circuitry includes capacitance sensing circuitry configured to detect the capacitance.

In an embodiment, the detecting circuitry further includes switching circuitry, and the switching circuitry is configured to switch the antenna electrode between coupling with the RF circuitry and coupling with the capacitance sensing circuitry.

In an embodiment, the switching circuitry is controlled by a control signal, and the switching circuitry is configured to: couple the antenna electrode to the RF circuitry in response to the control signal being in a first state, and couple the antenna electrode to the capacitance sensing circuitry in response to the control signal being in a second state.

In an embodiment, the control signal alters periodically between the first state and the second state, and/or the control signal is in the second state in response to the RF circuitry being in an idle state.

In an embodiment, the detecting circuitry includes a first filter electrically coupled between the antenna electrode and the capacitance sensing circuitry, and the first filter is a low-pass filter or a band-pass filter.

In an embodiment, the detecting circuitry further includes a second filter electrically coupled between the antenna electrode and the RF circuitry, and the second filter is a high-pass filter or a band-pass filter.

In an embodiment, a lower cut-off frequency of the first filter is lower than or equal to an upper cut-off frequency of the second filter.

In an embodiment, the operating signal is in a third state in a case that the capacitance is higher than a threshold capacitance, and in a fourth state in a case that the capacitance is lower than the threshold capacitance.

In an embodiment, the electrical parameter reflects a return loss of the antenna, and the detecting circuitry includes power sensing circuitry configured to detect the return loss.

In an embodiment, the detecting circuitry further includes a directional coupler, the antenna electrode is coupled to an input port of the directional coupler, the power sensing circuitry is coupled to a coupled port of the directional coupler, and the RF circuitry is coupled to a transmitted port of the directional coupler.

In an embodiment, when the wireless device performs wireless communication via electromagnetic waves of a first frequency, the operating signal is in a third state in a case that the return loss is higher than a first threshold, and in a fourth state in a case that the return loss is lower than the first threshold. When the wireless device performs wireless communication via electromagnetic waves of a second frequency, the operating signal is in the third state in a case that the return loss is lower than a second threshold, and in the fourth state in a case that the return loss is higher than the second threshold. The first frequency is lower than the second frequency.

In an embodiment, the distance is determined to be in a first range in a case that the operating signal is in the third state, and the distance is determined to be in a second range in a case that the operating signal is in the fourth state. The first range and the second range do not overlap, and the distance in the first range is smaller than the distance in the second range.

In an embodiment, a first operation of the wireless device is triggered in response to the operating signal being switched from the third state to the fourth state, and a second operation of the wireless device is triggered in response to the operating signal being switched from the fourth state to the third state.

In an embodiment, the first operation is switching the wireless communication from electromagnetic waves of a third frequency to the electromagnetic waves of a fourth frequency, and the second operation is switching the wireless communication from the electromagnetic waves of the fourth frequency to the electromagnetic waves of the third frequency.

In a second aspect, a method for sensing proximity of a wireless device to a body part of a user is provided, including: detecting an electrical parameter of an antenna electrode that serves at least a part of an antenna of the wireless device, outputting an operating signal based on the electrical parameter, and determining a distance between the antenna electrode and a body part of a user based on the operating signal.

In an embodiment, the electrical parameter reflects capacitance between the antenna electrode and a referential point.

In an embodiment, capacitance detecting circuitry is configured to detect the capacitance, and RF circuitry is configured to transmit or receive wireless signals via the antenna. Before detecting the electrical parameter of the antenna electrode, the method further includes: coupling the antenna electrode electrically to the capacitance detecting circuitry and decoupling the antenna electrode electrically from the RF circuitry, in response to a control signal being in a first state. The method further includes: decoupling the antenna electrode electrically from the capacitance detecting circuitry and coupling the antenna electrode electrically to the RF circuitry, in response to the control signal being in a second state.

In an embodiment, before outputting the operating signal based on the electrical parameter, the method further includes: removing a frequency component from the detected electrical parameter via a low-pass filter or a band-pass filter.

In an embodiment, outputting the operating signal based on the electrical parameter includes: outputting the operating signal in a third state in a case that the capacitance is higher than a threshold capacitance, and outputting the operating signal in a fourth state in a case that the capacitance is lower than the threshold capacitance.

In an embodiment, the electrical parameter reflects a return loss of the antenna.

In an embodiment, when the wireless device performs wireless communication via electromagnetic waves of a first frequency, outputting the operating signal based on the electrical parameter includes: outputting the operating signal in a third state in a case that the return loss is higher than a first threshold; and outputting the operating signal in a fourth state in a case that the return loss is lower than a first threshold. When the wireless device performs wireless communication via electromagnetic waves of a second frequency, outputting the operating signal based on the electrical parameter includes: outputting the operating signal in the third state in a case that the return loss is lower than a second threshold; and outputting the operating signal in the fourth state in a case that the return loss is higher than the second threshold. The first frequency is lower than the second frequency.

In an embodiment, determining the distance between the antenna electrode and the body part of the user based on the operating signal includes: determining that the distance is in a first range in response to the operating signal being in the third state; and determining that the distance is in a second range in response to the operating signal being in the fourth state. The first range and the second range do not overlap, and the distance in the first range is smaller than the distance in the second range.

In an embodiment, the method further includes: triggering a first operation of the wireless device in response to the operating signal being switched from the third state to the fourth state; and triggering a second operation of the wireless device in response to the operating signal being switched from the second state to the first state.

In an embodiment, the first operation is switching the wireless communication from electromagnetic waves of a third frequency to the electromagnetic waves of a fourth frequency. The second operation is switching the wireless communication from the electromagnetic waves of the fourth frequency to the electromagnetic waves of the third frequency.

In a third aspect, a wireless device is further provided, including any foregoing proximity sensor, and RF circuitry electrically coupled to the proximity sensor.

In a fourth aspect, a wireless device is further provided, including: a processor, and a memory storing instructions, where the instructions when executed by the processor configure the processor to perform any foregoing method.

According to embodiments of the present disclosure, the proximity sensor includes the antenna electrode and the detecting circuitry. The antenna electrode serves as at least the part of the antenna of the wireless device. The detecting circuitry is electrically coupled to the antenna electrode, and is configured to detect the electrical parameter of the antenna electrode and output the operating signal based on the electrical parameter. A distance between the antenna electrode and the body part of the user is capable to be determined based on the operating signal. Since the antenna electrode is generally disposed at a housing of wireless device, the distance reflects proximity of the wireless device to the body part of the user. That is, the proximity is detected via the antenna electrode, which is shared by both the proximity sensor and the antenna of the wireless device. It is neither necessary to provide an opening or a window on a housing for the proximity sensor, nor necessary to reserve an inner space for a component emitting proximity detecting signals. Hence, miniaturization of the wireless device can be significantly improved. Further, power consumption of the wireless device can be reduced due to the non-emissive detection.

It can be appreciated that the above technical advantages can be correspondingly applied to the method and the wireless device according to embodiments of the present disclosure, and hence are not repeated herein.

BRIEF DESCRIPTION OF THE DRAWINGS

For clearer illustration of the technical solutions according to embodiments of the present disclosure or conventional techniques, hereinafter briefly described are the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

FIG. 1 shows a schematic structural diagram of a proximity sensor according to an embodiment of the present disclosure.

FIG. 2*a* and FIG. 2*b* show schematic diagrams of an antenna of a wireless device according to an embodiment of the present disclosure.

FIG. 13 shows a flowchart of another method for sensing proximity of a wireless device to a body part of a user according to an embodiment of the present disclosure.

DETAILED DESCRIPTION OF THE EMBODIMENTS

Figure 3:
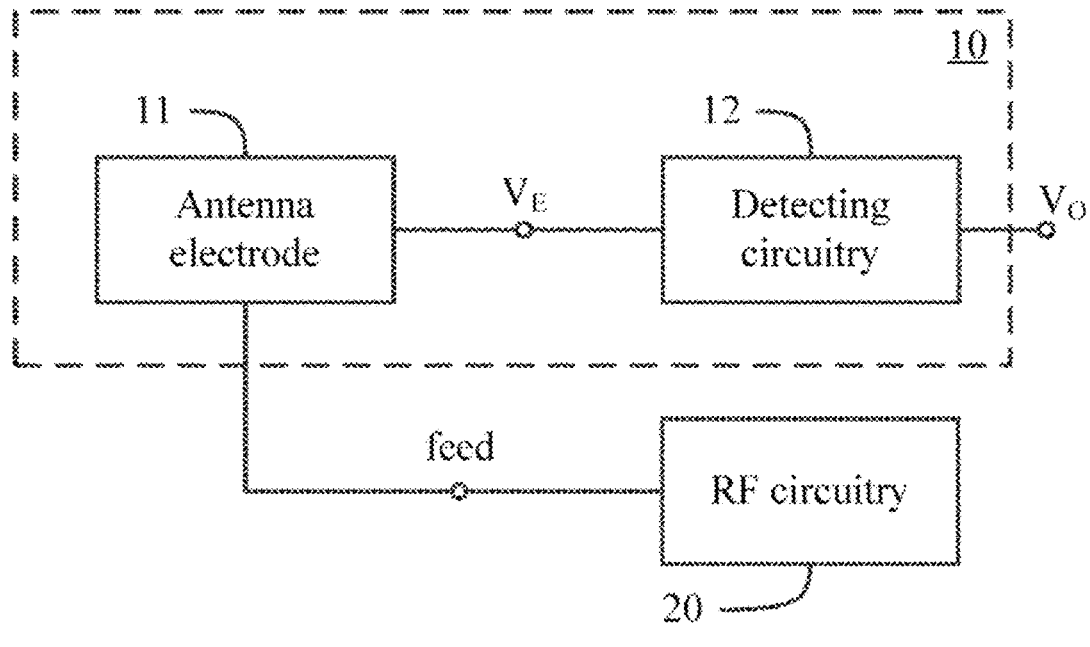
FIG. 3 shows a schematic structural diagram of another proximity sensor according to an embodiment of the present disclosure.

In order to make the object, technical solutions and advantages of the present application clearer, hereinafter technical solutions in some embodiments of the present disclosure are described in conjunction with the drawings in some embodiments of the present disclosure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

In order to facilitate usage and expand application environment, various wireless devices are designed as wearable to users, or at least in contact with a skin of a user during usage. Such wireless device in a "contacting" state, i. e. being worn by a user or at least attached to a skin of a user, would operate differently from that in an "idling" state, i. e. being not attached to a skin of a user. For example, an earbud or smart eyeglasses may play an audio/video in the contacting state, but may stand by in the idling state. For another example, a smart watch or a smart wristband may vibrate to prompt a user about an incoming message in the contacting state, but may suspend such function and/or switch to a "beep" mode in the idling state. Hence, switching between different operating modes is generally desirable during usage of such wireless device. In conventional technology, the switching may be manually implemented by a user. For example, the user may tap the earbud or the smart eyeglasses to suspend/resume playing of the audio/video. For another example, the user may press a physical button or a virtual button on the smart watch or the smart wristband to activate or deactivate the vibrating capability. Since the manual switching requires an intentional operation of the user, such scheme is troublesome and time wasting, and proximity sensors are proposed as a more feasible replacement of the manual switching.

Generally, the proximity sensor is mounted in the wireless device, and is configured to detect a distance between itself and a target, such as a body of the user. Most proximity sensors are time-of-flight sensor, which includes a transmitter for transmitting a detection signal and a receiver for receiving the detection signal reflected by the target, or a transceiver serving as both the transmitter and the receiver. The distance is determined based on a time interval between a moment of the transmitting and a moment of the receiving. The detection signal is modulated in, for example, infrared light, visible light, microwaves, or ultrasonic waves. In such configuration, the proximity sensor must have at least an emission part that emits the detection signal toward an outer space of the wireless device. For example, the emission part is a laser diode or a light emitting diode for emitting the infrared light or the visible light, or is an electrode for emitting the microwaves or the ultrasonic waves. Moreover, a housing of the wireless device must have at least an opening or a window that allows the detection signal to pass, and the opening or the wind must be arrange at a side facing the body of the user when the wireless device are worn. Both the emission part and the opening or the window are indispensable for the time-of-flight sensor, and would occupy a considerable space in the wireless device, thus bringing great difficulties in miniaturizing the wireless device. Further, the proximity detection would require continuous (or periodical) emission of the detection signal, which increases power consumption of the wireless device significantly.

In view of the above technical issue, a proximity sensor is provided according to embodiments of the present disclosure. Reference is made to FIG. 1, which shows a schematic structural diagram of a proximity sensor according to an embodiment of the present disclosure. The proximity sensor 10 is applied to a wireless device (not fully shown). The wireless device may be a wireless wearable device, which includes, but is not limited to, an earbud, smart eyeglasses, a virtual-reality (VR) head-mounted display, a smart mask, an electronic neckless, a smart watch, a smart wristband, an electronic glove, or the like. The wireless device may alternatively be another electronic device of which at least a part is in contact with a body of a user during usage, which includes, but is not limited to, a cell phone, a tablet, an e-book, a joystick, a gamepad, or the like. Generally, the wireless device includes components other that the proximity sensor, for example, a housing, a display, various types of processing circuitry, and communication circuitry for at least wireless communication.

The proximity sensor includes an antenna electrode 11 and detecting circuitry 12. The antenna electrode 11 serves as at least a part of an antenna of the wireless device. That is, the antenna electrode 11 may serve as the whole antenna of the wireless device, or the antenna electrode 11 only serves as a part of the antenna of the wireless device. In the latter case, the other part of the antenna may include another component of the wireless device, such as another electrode electrically coupled with the antenna electrode 11. Alternatively, the antenna may include a component not belong to the wireless device, such as an external metal component electrically connected to the antennal electrode 11, or a body part of a user in contact with the antennal electrode. It is further appreciated that the antenna electrode of the wireless device may operate as the whole antenna in one environment (e. g. when the wireless device disposed away from a body part of the user), while operate as a part of the antenna in another embodiment (e. g. when the wireless device disposed close to a body part of the user). In some embodiments, the antenna electrode 11 serving as the whole antenna may transmit wireless signals of a shorter wavelength than that serving as a part of the antenna. For example, the antenna electrode 11 may transmit Wi-Fi signals of 5 GHz when serving as the whole antenna, while transmit Wi-Fi signals of 2.4 GHz when serving as a part of the antenna. The present disclosure is not limited thereto, and wireless signals under other communication standards such as Bluetooth™ or 3GPP may be adopted.

As shown in FIG. 1, the antenna electrode 11 may be coupled to a feed of the antenna, such that the wireless device is capable to transmit or receive wireless signals via the antenna including the antenna electrode 11. In one embodiment, the feed is provided by communication circuitry of the wireless device. When the antenna transmits wireless signals, the communication circuitry would generate resonant currents that flow into the antenna electrode 11 via the feed. When the antenna receives wireless signals, at least a part of resonant currents would be generated in the antenna electrode 11, and flows into the communication circuitry via the feed. It is appreciated that in practice, there may be an additional element (not shown) coupled between the feed and the antenna electrode 11. The additional element may include, but is not limited thereto, a switch, a transistor, a capacitor, or a filter.

The detecting circuitry 12 is electrically coupled to the antenna electrode 11. In this embodiment, such coupling may be direct or indirect (i. e., via an additional element). The detecting circuitry 12 is configured to detect an electrical parameter $V_E$ of the antenna electrode, and output an operating signal Vo based on the electrical parameter. A distance d between the antenna electrode 11 and a body part of a user is capable to be determined based on the operating signal Vo.

In this embodiment, the electrical parameter $V_E$ may be of various types. For example, the electrical parameter $V_E$ may be a current, a voltage, a quantity of charge, or the like, which is directly measured on the antenna electrode 11. Alternatively, the electrical parameter $V_E$ may be a capacitance, a resistance, or an inductance, which is indirectly inferred from a parameter directly measured on the antenna electrode 11. The present disclosure is not limited thereto, as long as the electrical parameter $V_E$ can be converted into the operating signal Vo for determining the distance d. The conversion from the electrical parameter $V_E$ to the operating signal Vo may be implemented in various manners. In some embodiments, the conversion includes arithmetic operations such as addition, subtraction, multiplication, and/or division, in order to obtain an operating signal Vo that can be recognized by processing circuitry of the wireless device. Additionally or alternatively, the conversion is implemented through a comparator, which compares the electrical parameter $V_E$, or a parameter derived from the electrical parameter $V_E$, with one or more thresholds, to determine a value of the operating signal Vo. It is appreciated that an analog-to-digital converter may participate in the conversion in a case that the electrical parameter $V_E$ is analog while the desired operating signal Vo is digital.

The distance d being capable to be determined based on the operating signal Vo suggests that information of the distance d is at least partially embodied in the operating signal Vo through the electrical parameter $V_E$. That is, a change in the distance d should be reflected by the electrical parameters $V_E$, such that a value of the operating signal Vo may be a function of the distance d. In one embodiment, the function may be monotonic throughout the whole domain of definition of the distance d. In another embodiment, the function may be a piecewise function, and the value of the function in each domain interval may be a unique constant. The present disclosure is not limited thereto, as long as the distance d can be determined from the operating signal Vo.

In summary, the proximity sensor 10 according the foregoing embodiments of the present disclosure includes the antenna electrode 11 and the detecting circuitry 12. The antenna electrode 11 serves as at least the part of the antenna of the wireless device. The detecting circuitry 12 is electrically coupled to the antenna electrode 11, and is configured to detect the electrical parameter $V_E$ of the antenna electrode 11 and output the operating signal Vo based on the electrical parameter $V_E$. The distance d between the antenna electrode 11 and the body part of the user is capable to be determined based on the operating signal Vo. Since the antenna electrode 11 is generally disposed at a housing of wireless device, the distance d reflects proximity of the wireless device to the body part of the user. That is, the proximity is detected via the antenna electrode 11, which is shared by both the proximity sensor 10 and the antenna of the wireless device. It is neither necessary to provide an opening or a window on a housing for the proximity sensor, nor necessary to reserve an inner space for a component emitting proximity detecting signals. Hence, miniaturization of the wireless device can be significantly improved. Further, power consumption of the wireless device can be reduced due to the non-emissive detection.

Hereinafter exemplary examples of the proximity sensor are illustrated by way of embodiments of the present disclosure.

In some embodiments, the body part serves as another part of the antenna. A return loss of the antenna is decreased when the distance is decreased for wireless signals of at least one communication standard applicable to the wireless device. Reference is made to FIG. 2a and FIG. 2b, which show schematic diagrams of an antenna of a wireless device according to an embodiment of the present disclosure. Coupling between the antenna electrode 11 and the body part is growing when the antenna electrode 11 is approaching the body part. As shown in FIG. 2a, the distance d is large when the antenna electrode 11 is far away from the body part, namely, when the wireless device is far away from the body part. In such case, the coupling is weak, and the wireless device transmits and receives the wireless signals mainly via the antenna electrode 11. That is, the antenna electrode 11 alone, or nearly alone, serves as the antenna. As shown in FIG. 2b, the distance d is small when the antenna electrode 11 is close to the body part, namely, when the wireless device is close to the body part. In such case, the coupling is strong, and the wireless device transmits and receives the wireless signals via both the antenna electrode 11 and the body part. That is, the antenna electrode serves as a part of the antenna, and the body part serves as another part of the antenna.

The return loss decreasing with the distance d for wireless signals of a certain communication standard means that the wireless device when operating under that standard is desired to attach to the body part, so as to minimize the distance d and achieve a minimum return loss. It can be appreciated that a designed dimension (e. g. a length) of the antenna for achieving the minimum return loss is generally determined by a wavelength of the wireless signals transmitted or received by the wireless device, for example, the antenna may be a quarter-wavelength antenna or a half-wavelength antenna. When the body part also serves as a part of the antenna, the body part is capable to compensate such designed dimension, so that the antenna electrode 11 can be designed to have a smaller size (than a case of the antenna electrode 11 alone serving as the antenna) without increasing the return loss, i. e. without deteriorating a quality of the wireless communication. Thus, miniaturization of the wireless device can be further improved.

The antenna in FIG. 2a may transmit or receive wireless signals of a different wavelength in comparison with the antenna in FIG. 2b. As mentioned above, the antennas in FIG. 2a and FIG. 2b may be configured to transmit or receive Wi-Fi signals of 5 GHz and 2, 4 GHz, respectively. It is appreciated that the wavelength (or frequency) of the transmitted or receive signals is controlled by, for example, communication circuitry of the wireless device.

In some embodiments, the antenna electrode 11 is located at a first portion of the wireless device. The first portion may include at least a part of a housing of the wireless device, such that the antenna electrode 11 is capable to stay close to a surface of the wireless device. Thereby, proximity of the antenna electrode to the body part may represent proximity of the wireless device to the body part. A specific form of the first portion may be determined by a type of the wireless device. In one embodiment, the first portion is configured to contact the body part during usage of the wireless device. As an example, when the wireless device is an earbud, the first portion may be a shell configured to insert into the ear canal or contact the auricle. As another example, when the wireless device is smart eyeglasses, the first portion may be a temple tip or a nose pad. As another example, when the wireless device is a smart watch, the first portion may be a bottom of the case. The present disclosure is not limited to the above examples. It is appreciated that the aforementioned "during usage of the wireless device" refers to when the wireless device is used in at least one operation mode thereof, and the wireless device may be used in another operation mode when the first portion is not in contact with the body part.

A location of the antenna electrode 11 in the first portion is not specifically limited. In one embodiment, the antenna electrode 11 is exposed at a surface of a housing of the wireless device. In such case, the exposed antenna electrode 11 may be a metal inlay in an insulating part of the housing, or may be a metal part of the housing. The distance d may serve as a distance between the wireless device and the body part. For example, d=0 represents that the wireless device is attached to a skin of the body part. In another embodiment, the antenna electrode 11 is separated from a surface of a housing of the wireless device by a distance d' In such case, the antenna electrode 11 may be embedded in an insulating part of the housing, and is covered by an insulating material of a thickness d'. A distance d-d' may serve as a distance between the wireless device and the body part. For example, d=d' represents that the wireless device is attached to a skin of the body part.

In some embodiments, the antenna electrode 11 is electrically coupled to radio frequency (RF) circuitry 20 of the wireless device. Reference is made to FIG. 3, which shows a schematic structural diagram of another proximity sensor according to an embodiment of the present disclosure. The RF circuitry 20 is configured to transmit or receive wireless signals via the antenna. The RF circuitry 20 may serve as the communication circuitry, or at least a part of the communication circuitry, as mentioned above. The communication circuitry may have functions other than transmitting and receiving RF signals via the antenna. For example, the communication circuitry may be configured to transmit and receive signals through wired communication. It is appreciated that the RF circuitry 20 may be coupled to the antenna electrode 11 via the feed, as shown in FIG. 3. In one embodiment, the RF circuitry 20 and the detecting circuitry 12 is located on a same print circuit board (PCB) of the wireless device. The PCB may further have other circuitry of the wireless device, such as processing circuitry, display circuitry, or control circuitry. Integrating different circuitry on a same PCB would improve compactness of components within the wireless device.

There is intrinsic capacitance between a skin of the user and the ground, and a value of the intrinsic capacitance is determined by a body part at which the intrinsic capacitance is measured. Therefore, when the antenna electrode 11 approaches the body part, capacitance between the antenna electrode 11 and the ground would increase gradually, because the intrinsic capacitance serves as a shunt capacitance between the antenna electrode 11 and the ground. Accordingly, when a potential at a referential point is constant, i. e. the referential point having a constant potential, capacitance between the antenna electrode 11 and the referential point would increase gradually with the decreasing distance d. In some embodiments, the electrical parameter $V_E$ reflects capacitance between the antenna electrode and a referential point. The referential point may be grounded, or may be provided with a preset potential. As discussed above, the electrical parameter $V_E$ reflecting the capacitance may refer to the capacitance itself, or may refer to another directly-measured electrical parameter from which the capacitance can be derived. The directly-measured electrical parameter may be, for example, a quantity of charge, or a temporal integral of a current.

Correspondingly, the detecting circuitry 12 includes capacitance sensing circuitry 121 that is configured to detect the capacitance. The capacitance sensing circuitry 121 may be directly or indirectly coupled to the antennal electrode 11, which is not limited in this embodiment. In one embodiment, the capacitance sensing circuitry 121 includes an integrator circuit and a differentiator circuit which are connected in series, and thereby is capable to convert the capacitance into a voltage for measurement. In another embodiment, the capacitance sensing circuitry 121 includes a resonator circuit, and thereby is capable to convert the capacitance into a resonating frequency/period.

Hereinafter some embodiments are illustrated for the electrical parameter $V_E$ reflecting the capacitance.

First Embodiment

Figure 4:
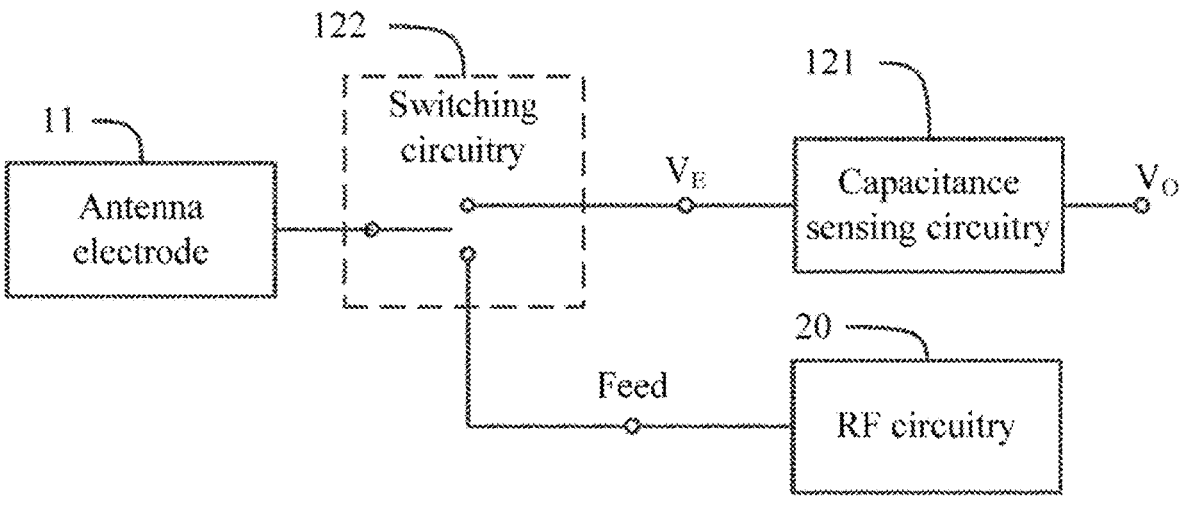
FIG. 4 shows a schematic structural diagram of another proximity sensor according to an embodiment of the present disclosure.

Reference is made to FIG. 4, which shows a schematic structural diagram of another proximity sensor according to an embodiment of the present disclosure. In a first embodiment, the detecting circuitry 12 further includes switching circuitry 122, and the switching circuitry 122 is configured to switch the antenna electrode 11 between coupling with the RF circuitry 20 and coupling with the capacitance sensing circuitry 121. As shown in FIG. 4, the switching circuitry 122 may have a structure similar to a single-pole double-throw switch, so as to implement the switching. The present disclosure is not limited thereto, and other structures may be appropriate as long as the switching can be implemented. The switching circuitry 122 operates in either a first mode and a second mode: in case of the first mode, the antenna electrode 11 is electrically decoupled from the capacitance sensing circuitry 121 and coupled to the RF circuitry 20; and in case of the second mode, the antenna electrode is electrically coupled to the capacitance circuitry 121 and decoupled from the RF circuitry 20.

In one embodiment, the first mode and the second mode are controlled based on a control signal inputted into the switching circuitry 122. For example, the control signal may have two states, i. e. a first state and the second state. In such case, the switching circuit 122 may be controlled to operate in the first mode in response to the control signal being in the first state, and operate in the second mode in response to the control signal being in the second state. The first state and the second state may be implemented in various forms. As an example, the control signal is a digital signal, and the first state and the second state may correspond to logic "1" and "0", respectively, or logic "0" and "1", respectively. As another example, the control signal is an analog signal, and the first state and the second state may correspond to two ranges of a value of the control signal that do not overlap with each other. In an embodiment, the two ranges may be being greater than a threshold, and being smaller than or equal to the threshold, respectively. It is appreciated that the present disclosure is not limited to the above two examples, and the control signal may be otherwise configured as long as the first state can be distinguished from the second state. For example, the control signal may include two channels of signals, the first state refers to the signal in one channel is in an active state, and the second state refers to the signal in the other channel is in an active state.

The first mode and the second mode may be controlled according to various schemes. In an embodiment, the first mode and the second mode alter periodically. Duration of the first mode and the second mode may be preset in each period. As an example, when the first state and the second state as mentioned above are high and low levels, the control signal may be configured as a square wave having a preset duty cycle. In another embodiment, the first mode and the second mode are controlled based on a state of the RF circuitry 20. The second mode is activated when the RF circuitry 20 is in an idling state, i. e. when the wireless communication is suspended or terminated. As an example, the control signal is transmitted from the RF circuitry 20, and is in the second state in response to the RF circuitry is in the idling state. Correspondingly, the control signal may be switched to the first state in response to the RF circuitry recovers performing the wireless communication.

In the first embodiment, the switching circuitry 122 serves as isolation between the capacitance sensing circuitry 121 and the RF circuitry 20. Thereby, the RF signals applied on the antenna electrode 11 would not influence the capacitance detection, and a signal applied on the antennal electrode 11 for detecting the capacitance would not introduce noise into the wireless signals. In other words, the switching circuitry 122 is applied to avoid interference between the detecting circuitry 12 and the RF circuitry 20 that share the antenna electrode 11.

Second Embodiment

Figure 5:
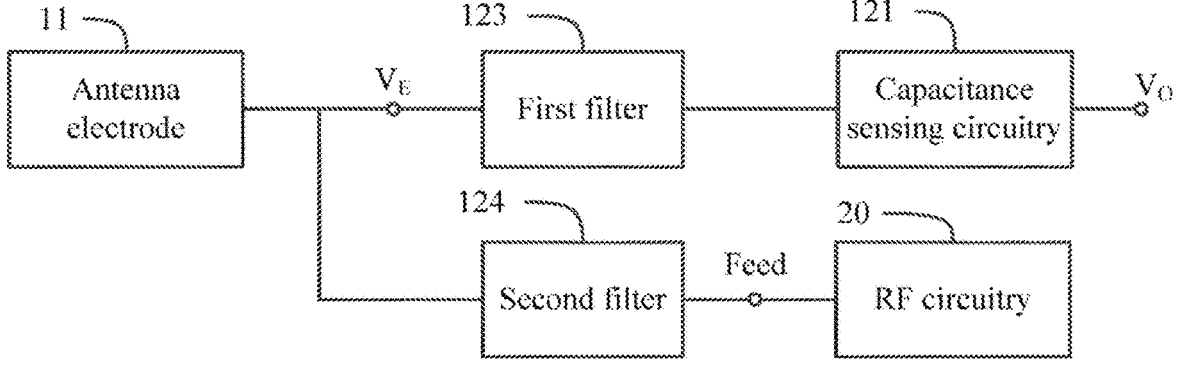
FIG. 5 shows a schematic structural diagram of another proximity sensor according to an embodiment of the present disclosure.

Reference is made to FIG. 5, which shows a schematic structural diagram of another proximity sensor according to an embodiment of the present disclosure. In a second embodiment, the detecting circuitry 12 includes a first filter 123 electrically coupled between the antenna electrode 11 and the capacitance sensing circuitry 121. The first filter 123 may be a low-pass filter or a band-pass filter, which is configured to remove a high-frequency component in the electrical parameter $V_E$, i. e. the capacitance, detected on the antenna electrode 11. It can be appreciated that such high-frequency component comes from the wireless signals generated in the communication branch (i. e. the RF circuitry 20 and the antennal electrode 11), and would reduce accuracy of the capacitance detection since it "pollutes" the capacitance signal. Hence, an upper cut-off frequency of the first filter (the low-pass filter may be regarded as a lower cut-off frequency being negative infinite) may be determined by a frequency of the wireless signals. Generally, the upper cut-off frequency is in a range from 20 MHz to 600 MHz, for most conventional wireless communication standards.

In an embodiment as shown in FIG. 5, the detecting circuitry 12 further includes a second filter 124 electrically coupled between the antenna electrode 11 and the RF circuitry 20. The second filter 124 is a high-pass filter or a band-pass filter, which is configured to remove a low-frequency component that is generated in the detection branch (i. e. the capacitance sensing circuitry 121 and the antennal electrode 11). Such low-frequency component may come from an internal source, i. e. may be generated by a means of detecting the capacitance, which is adopted by the capacitance sensing circuitry 121. Additional or alternatively, such low-frequency component may come from an external source, i.e., may be generated by an electromagnetic background of an ambient environment. It can be appreciated that the second filter 124 prevents the low-frequency component from entering the RF circuitry 20 and "polluting" the wireless signal. Hence, a lower cut-off frequency of the second filter (the high-pass filter may be regarded as an upper cut-off frequency being positive infinite) may be determined by a frequency of the wireless signals. Similarly, the lower cut-off frequency is in a range from 20 MHz to 600 MHz for most conventional wireless communication standards.

In the second embodiment, the first filter 121 and/or the second filter 122 serve as isolation between the capacitance sensing circuitry 121 and the RF circuitry 20. Similar to the first embodiment, the RF signals applied on the antenna electrode 11 would not influence the capacitance detection, and a signal applied on the antennal electrode 11 for detecting the capacitance would not introduce noise into the wireless signals. Hence, both the first filter 121 and the second filter 122 are capable to avoid interference between the detecting circuitry 12 and the RF circuitry 20 that share the antenna electrode 11.

When the detecting circuitry 12 includes both the first filter 123 and the second filter 124, passbands of the two may not overlap with each other, such that the isolation between the capacitance sensing circuitry 121 and the RF circuitry 20 is improved. In one embodiment, the cut-off frequency of the first filter is lower than or equal to the cut-off frequency of the second filter.

Third Embodiment

Figure 6:
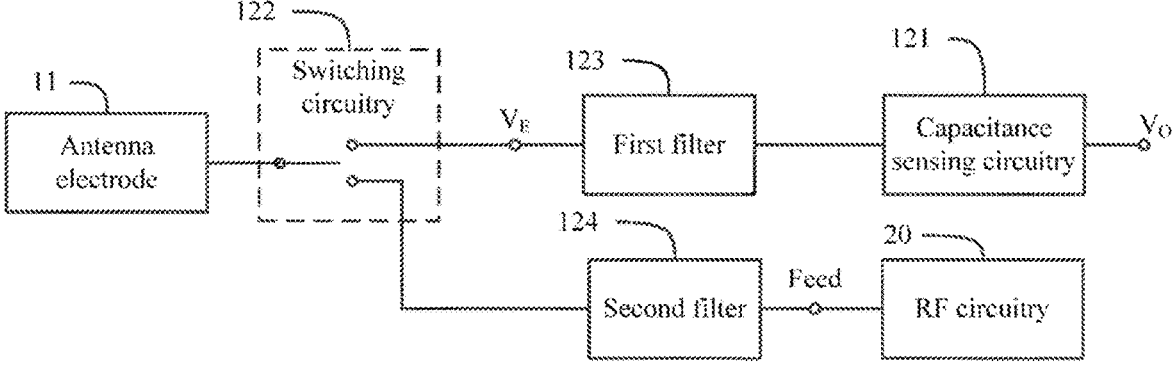
FIG. 6 shows a schematic structural diagram of another proximity sensor according to an embodiment of the present disclosure.

Reference is made to FIG. 6, which shows a schematic structural diagram of another proximity sensor according to an embodiment of the present disclosure. In a third embodiment, the detecting circuitry may include the first filter 123 and/or the second filter 124 in addition to the switching circuitry 122. That is, the third embodiment may be regarded as a combination of the first embodiment and the second embodiment. Coordination between the switching circuitry 122 and the filter(s) strengthen the isolation between the capacitance sensing circuitry 121 and the RF circuitry 20. Such scheme would be quite favorable when a dimension of the switching circuitry 121 is small and there is an inevitable interference between the two terminals coupled with the capacitance sensing circuitry 121 and the RF circuitry 20 respectively. Further, the filter(s) may reduce an impact of signal jumping, which is caused by the switching between the first mode and the second mode, on the wireless signals and the capacitance signal.

As discussed above, the capacitance between the antenna electrode 11 and the referential point would increase gradually with the decreasing distance d. On a basis of the foregoing embodiments (including the first embodiment to the third embodiment), the output signal Vo may be configured to have at least two states, including a third state and a fourth state, which reflect different ranges of the distance d. The third state and the fourth state may be implemented in various forms similar to the first state and the second state, details of which are not repeated herein. In some embodiments, the operating signal Vo is in the third state in a case that the capacitance is higher than a threshold capacitance, and in the fourth state in a case that the capacitance is lower than the threshold capacitance. The capacitance equal to the threshold capacitance may be predetermined to correspond to either the third state or the first state. It is appreciated that the third state and the fourth state may be defined in other manners. For example, the operating signal is in the third state in a case that the capacitance is within a lower range, and in the fourth state in a case that the capacitance is within a higher range. The lower range or the higher range may not be continuous, and the two ranges may not be adjacent. It is further appreciated that the at least two states may include another state besides the third state and the fourth state.

Correspondingly, in the above embodiments, the distance d may be determined to be in a first range in a case that the operating signal is in the third state, and may be determined to be in a second range in a case that the operating signal is in the fourth state. Due to the monotonous relationship between the capacitance and the distance d, the first range and the second range do not overlap, and the distance d in the first range is smaller than the distance in the second range.

Since the capacitance between the antenna electrode 11 and the ground increases when the wireless device approaches the body part, a resonant frequency for the antenna would decrease with the decreasing distance d, based on the basis relationship $1/f_o=2\pi\sqrt{LC}$ of resonant circuits. Hence, impedance matching between the antenna and the RF circuitry 20 are enhanced or weakened in response to a change of the distance d. In a case that a frequency of the wireless signals transmitted by the RF circuitry is unchanged, the S11 coefficient (a negative of return loss) of the antenna would be correspondingly decreased or increased. In some embodiments, the electrical parameter $V_E$ reflects a return loss of the antenna. Since a value of the return loss is a function of a frequency of signals fed into the antenna, herein the return loss refers to a real-time return loss, that is, the return loss of the antenna with respect to the wireless signals being generated by the RF circuitry 20. Similar to the forgoing capacitance case, the electrical parameter $V_E$ reflecting the reflecting the return loss may refer to the return loss itself, or may refer to another directly-measured electrical parameter from which the return loss can be derived. The directly-measured electrical parameter may be, for example, a power reflected by the antenna, where it is assumed that a corresponding incident power is known or constant.

Correspondingly, the detecting circuitry 12 includes power sensing circuitry 125 that is configured to detect the return loss. The power sensing circuitry 125 may be directly or indirectly coupled to the antennal electrode 11, which is not limited in this embodiment. The power sensing circuitry 125 may be configured to detect a power of the wireless signals reflected by the antenna. It can be appreciated that the reflected wireless signals are transmitted from the antenna module 11 to the power sensing circuitry 125. The detected power may be an average power of a peak power of the reflected signals, which is not limited in this embodiment. In one embodiment, the power sensing circuitry 125 includes at least one power detector.

Hereinafter some embodiments are illustrated for the electrical parameter $V_E$ reflecting the return loss.

Fourth Embodiment

Figure 7:
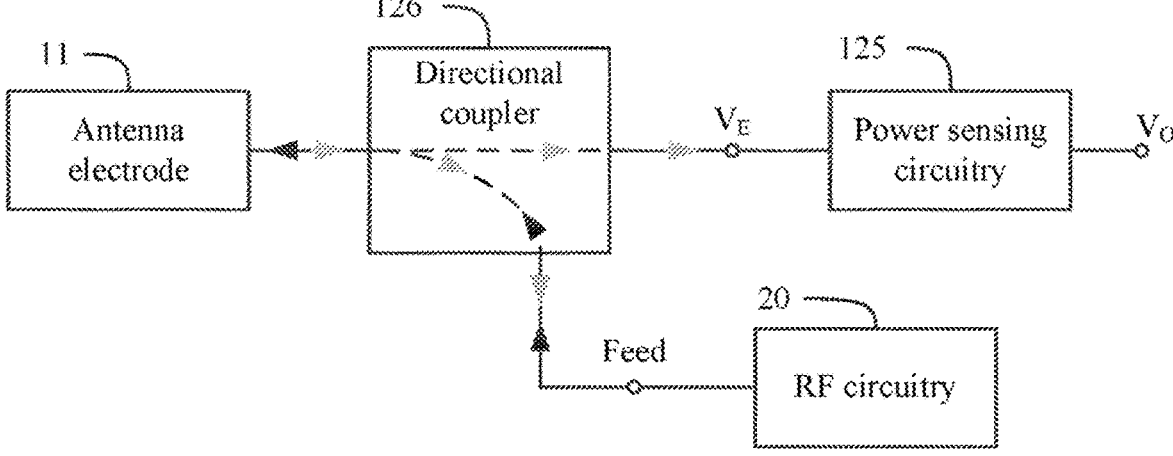
FIG. 7 shows a schematic structural diagram of another proximity sensor according to an embodiment of the present disclosure.

Reference is made to FIG. 7, which shows a schematic structural diagram of another proximity sensor according to an embodiment of the present disclosure. In a fourth embodiment, the detecting circuitry 12 further includes a directional coupler 126. Generally, the directional coupler has at least three ports, i. e. an input port, a coupled port, and a transmitted port (also known as an output port). Power transmission between the input port and transmitted port are bidirectional. In case of transmission from the input port, a certain ratio of power would reach the transmitted port, while the other would reach the coupled port, i. e. partial coupling. In case of transmission from the transmitted port, all power may reach the input port, i. e. zero coupling. No power can be transmitted from the transmitted port to the coupled port. It is assumed that a source having a power P1 is provided at the transmitted port, a load having a return loss RL is provided at the input loss, and the coupling from the input port to the coupled port is equal to CP, where P1 is in unit of dBm, RL and CP are in unit of dB. In such case, a power P2 measured at the coupled port would be equal to P1-RL-CP, that is, there is RL=P1-P2-CP. When P1 and CP are constant, RL is in linear correlation with P2.

Therefore, in one embodiment based on a three-port directional coupler, the antenna electrode 11 is coupled to an input port of the directional coupler 126, the power sensing circuitry 125 is coupled to a coupled port of the directional coupler 126, and the RF circuitry 20 is coupled to a transmitted port of the directional coupler 126, as shown in FIG. In FIG. 7, black arrows indicated directions of power transmission concerning the wireless signals generated by the RF circuitry 20, and grey arrow indicated directions of power transmission concerning the wireless signals reflected by the antenna (i. e. from the antenna module 11). As discussed above, the power detected at the coupled port (namely, $V_E$) is capable to reflect the return loss of the antenna at the input port.

Figure 8:
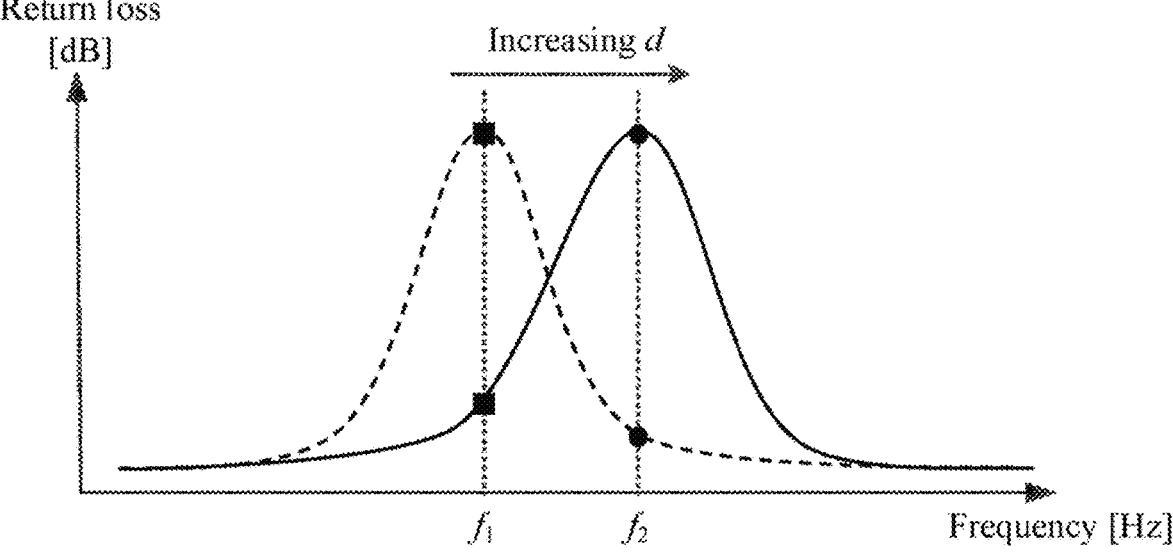
FIG. 8 shows a schematic graph of return losses of an antenna of a wireless device against frequency of wireless signals according to an embodiment of the present disclosure.

Hereinafter a relationship between the power loss and the distance d is brief discussed. Reference is made to FIG. 8, which shows a schematic graph of return losses of an antenna of a wireless device against frequency of wireless signals according to an embodiment of the present disclosure. The dashed line and the solid line in FIG. 8 represent curves of the return loss corresponding d=d₁ and d=d₂, respectively, where $d_1<d_2$. It can be appreciated that the return loss of the antennal would always be maximum when the frequency of wireless signals is equal to the resonant frequency of the antenna, namely, in case of a "fully match" between the antenna and the RF circuit 20 and a minimum reflection coefficient of the antenna. The greater the frequency of the wireless signals deviates from the resonant frequency of the antenna, the smaller the return loss is, i. e. the stronger the reflection at the antenna is. As discussed above, the resonant frequency for the antenna would increase when the distance d increases, and thereby the resonant frequency $f_1$ corresponding to d=$d_1$ is greater than the resonant frequency $f_2$corresponding to d=$d_2$. That is, a contour of the return loss would gradually changes from the dashed line to the solid line when the distance d is increased from $d_1$ to $d_2$. In such process, as shown in FIG. 8, the return loss at the frequency $f_1$ (indicated by solid squares) decreases due to increasing reactance mismatch between the antenna and the RF circuitry 20, while the return loss at the frequency $f_2$ (indicated by solid circles) increases due to decreasing reactance mismatch between the antenna and the RF circuitry 20. Since the return loss at $f_1$ or $f_2$ is a monotonous function with respect to the distance d, it is capable to serve as a basis for discriminating the distance d from the range [$d_1$, $d_2$]. It can be derived from the example as shown in FIG. 8 that the return loss at a frequency lower than $f_1$ or higher than $f_2$ is also a monotonous function with respect to the distance d, except that it has a smaller range of variation. Hence, such frequency may also serve as the basis for discriminating the distance d from the range [$d_1$, $d_2$].

The output signal Vo may be configured according to the forgoing relationship between the return loss and the distance d. On a basis of the foregoing embodiments (including the fourth embodiment), the output signal Vo may be configured to have at least two states, including a third state and a fourth state, which reflect different ranges of the distance d. The third state and the fourth state may be implemented in various forms similar to those as described in the foregoing embodiments concerning capacitance detection, details of which are not repeated herein. In some embodiments, when the wireless device performs wireless communication via electromagnetic waves of a first frequency, i. e. the wireless signals of the first frequency, the operating signal is in the third state in a case that the return loss is higher than a first threshold, and in the fourth state in a case that the return loss is lower than the first threshold. The return loss equal to the first threshold may be predetermined to correspond to either the third state or the first state. Additionally or alternatively, when the wireless device performs wireless communication via electromagnetic waves of a second frequency, i. e. the wireless signals of the second frequency, the operating signal is in the third state in a case that the return loss is lower than a second threshold, and in the fourth state in a case that the return loss is higher than the second threshold. The first frequency is lower than the second frequency. The return loss equal to the second threshold may be predetermined to correspond to either the third state or the first state.

Correspondingly, in the above embodiments, the distance d may be determined to be in a first range in a case that the operating signal is in the third state, and may be determined to be in a second range in a case that the operating signal is in the fourth state. Due to the monotonous relationship between the capacitance and the distance d, the first range and the second range do not overlap, and the distance d in the first range is smaller than the distance in the second range.

The state of the operating signal Vo may be configured to trigger one or more operations of the wireless device. In some embodiments, a first operation of the wireless device is triggered in response to the operating signal Vo being switched from the third state to the fourth state. Additionally or alternatively, a second operation of the wireless device is triggered in response to the operating signal Vo being switched from the fourth state to the third state. Specific forms of the first operation and the second operation may be relevant to a type of the wireless device. As an example, when the wireless device is an earbud, the first operation may be suspending playing music or hanging off a phone, and/or the second operation may be resuming playing music or picking up a phone. As another example, when the wireless device is a smart watch, the first operation may be exiting a message-vibration mode, and/or the second operation may be entering a message-vibration mode. As another example, when the wireless device is a gamepad or a joy stick, the first operation may be searching for and connecting to a game console, and/or the second operation may be disconnecting from the console. It can be appreciated that in many wireless devices, the first operation may be exiting a low-power mode, and/or the second operation may be entering the low-power mode. It can be further appreciated that the first operation and the second operation may be sending an instruction to another device via wireless or wired communication. For example, when the other device a cell phone, the first operation and the second operation may be instructing the cell phone to enter and exit a lock-screen mode, respectively. For example, when the other device is a game console, the first operation and the second operation may be instructing the game console to pause and resume, respectively, in an on-going game. The present disclosure is not limited to the foregoing examples.

In some embodiments, the state of the operating signal Vo may be configured to determine frequencies of the wireless signals transmitted by the RF circuitry 20, or even a wireless communication standard used by the wireless device. In one embodiment, the first operation is switching the wireless communication from electromagnetic waves of a third frequency to the electromagnetic waves of a fourth frequency. Additionally or alternatively, the second operation is switching the wireless communication from the electromagnetic waves of the fourth frequency to the electromagnetic waves of the third frequency. The third frequency may be equal to or approximate the foregoing first frequency, and the fourth frequency may be equal to or approximate the foregoing second frequency. In such case, the wireless device is capable to switch to a frequency having the larger return loss automatically, when the wireless device approaches or moves away from the body part, so as to ensure a good quality of the wireless communication.

Figure 9:
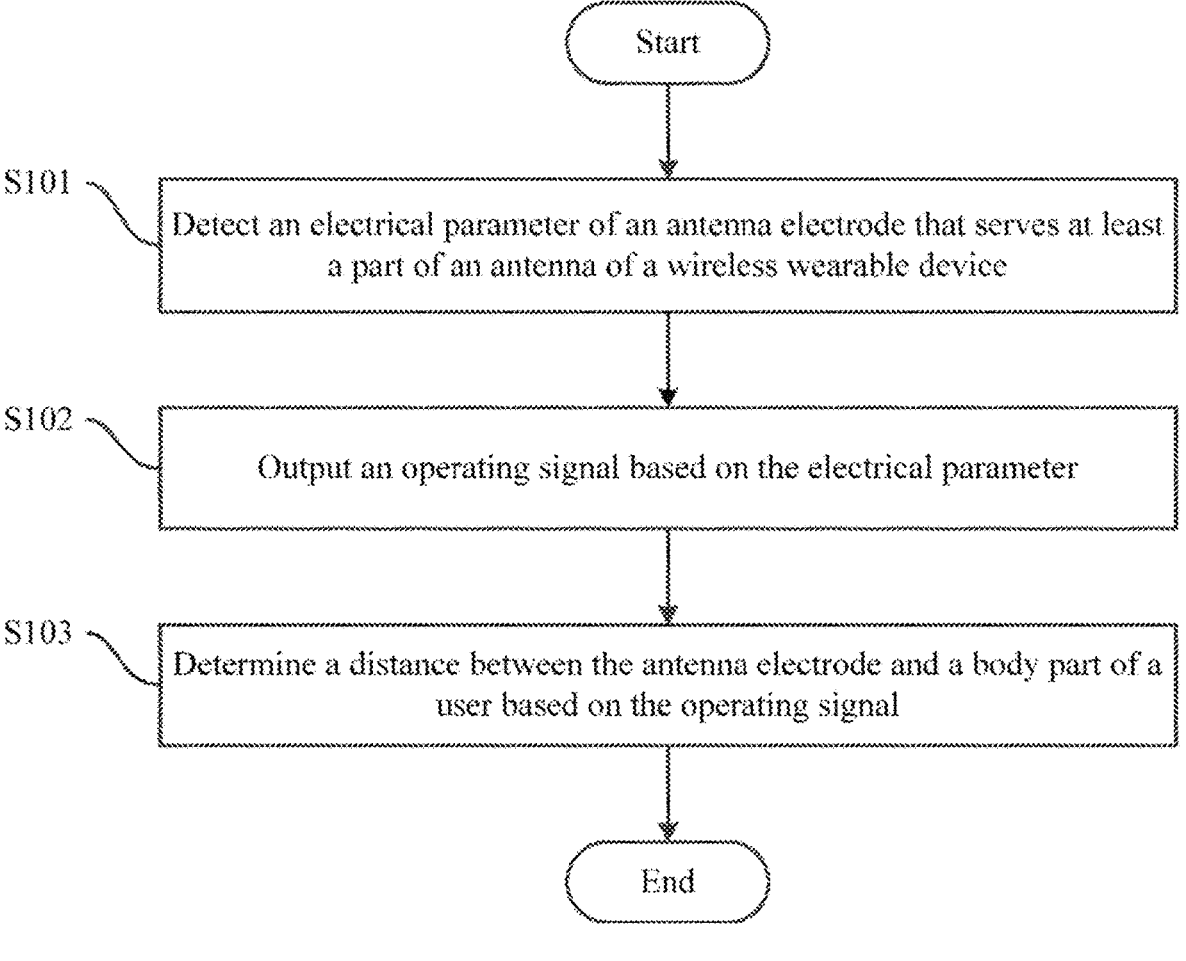
FIG. 9 shows a flowchart of a method for sensing proximity of a wireless device to a body part of a user according to an embodiment of the present disclosure.

In correspondence with the foregoing embodiments concerning the proximity sensor, a method for sensing proximity of a body part of a user to a wireless device is further provided according to embodiments of the present disclosure. Reference is made to FIG. 9, which shows a flowchart of a method for sensing proximity of a wireless device to a body part of a user according to an embodiment of the present disclosure. The method includes following steps S101 to S103.

In step S101, an electrical parameter of an antenna electrode that serves at least a part of an antenna of the wireless device is detected.

In step S102, an operating signal is outputted based on the electrical parameter.

In step S103, a distance between the antenna electrode and a body part of a user is determined based on the operating signal.

The steps S101 and S102 may be performed by the proximity sensor as described in the foregoing embodiments. The step S103 may be performed by the proximity sensor, or may be performed by processing circuitry of the wireless device to which the proximity sensor is applied. The present disclosure is not limited to either case.

In some embodiments, the electrical parameter reflects capacitance between the antenna electrode and a referential point.

Figure 10:
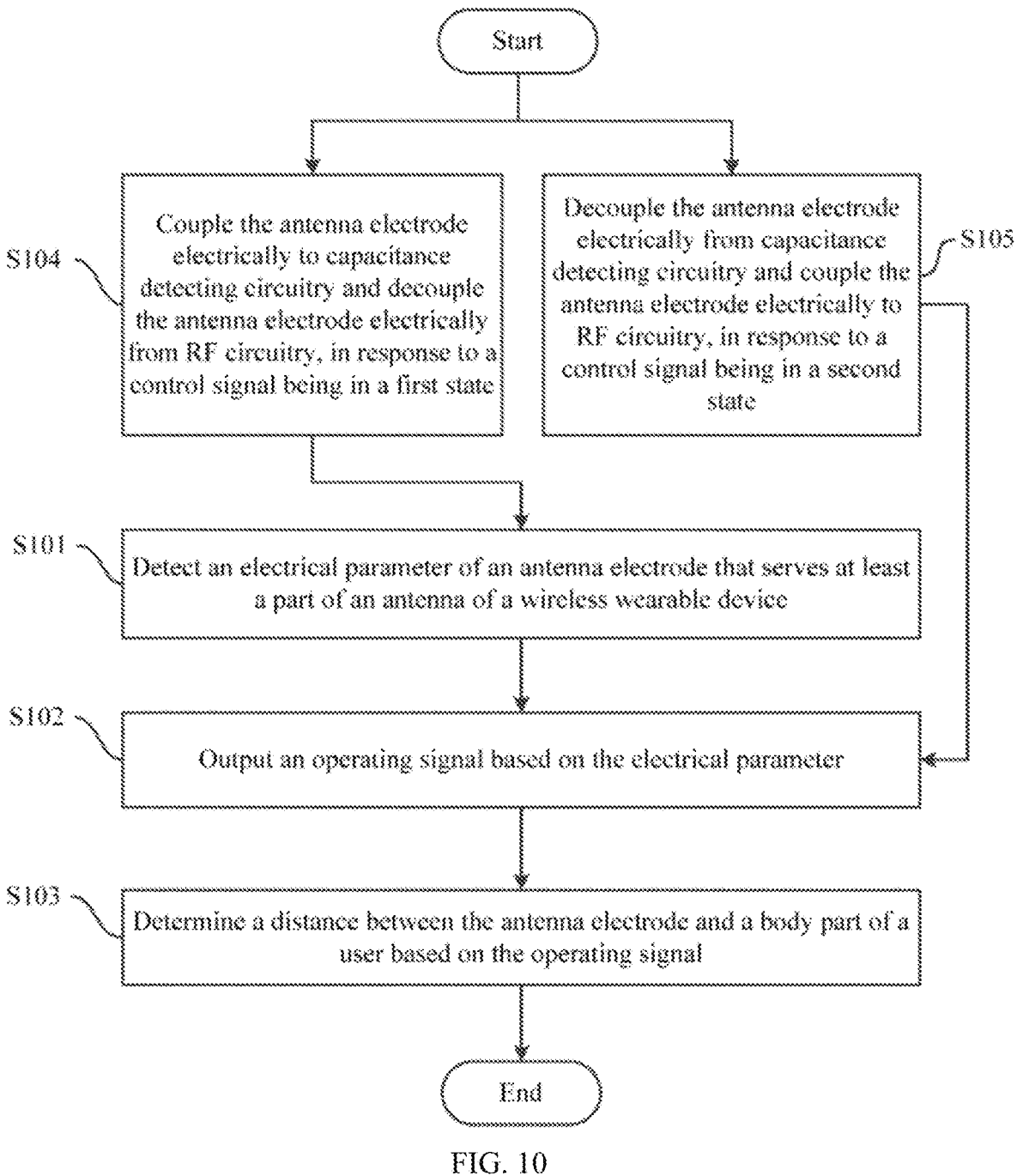
FIG. 10 shows a flowchart of another method for sensing proximity of a wireless device to a body part of a user according to an embodiment of the present disclosure.

In some embodiments, capacitance detecting circuitry is configured to detect the capacitance, and RF circuitry is configured to transmit or receive wireless signals via the antenna. Details of the capacitance detecting circuitry and the RF circuitry may refer to the foregoing embodiments, and are not repeated herein. Reference is further made to FIG. 10, which shows a flowchart of another method for sensing proximity of a wireless device to a body part of a user according to an embodiment of the present disclosure. In some embodiments, the method include step S104 before the step S101, and further include step S105.

In step S104, the antenna electrode is electrically coupled to the capacitance detecting circuitry, and is electrically decoupled from the RF circuitry, in response to a control signal being in a first state.

In step S105, the antenna electrode electrically decoupled from the capacitance detecting circuitry, and is electrically coupled to the RF circuitry, in response to the control signal being in a second state.

Details of the first state and the second state of the control signal may refer to the foregoing embodiments, and are not repeated herein.

Figure 11:
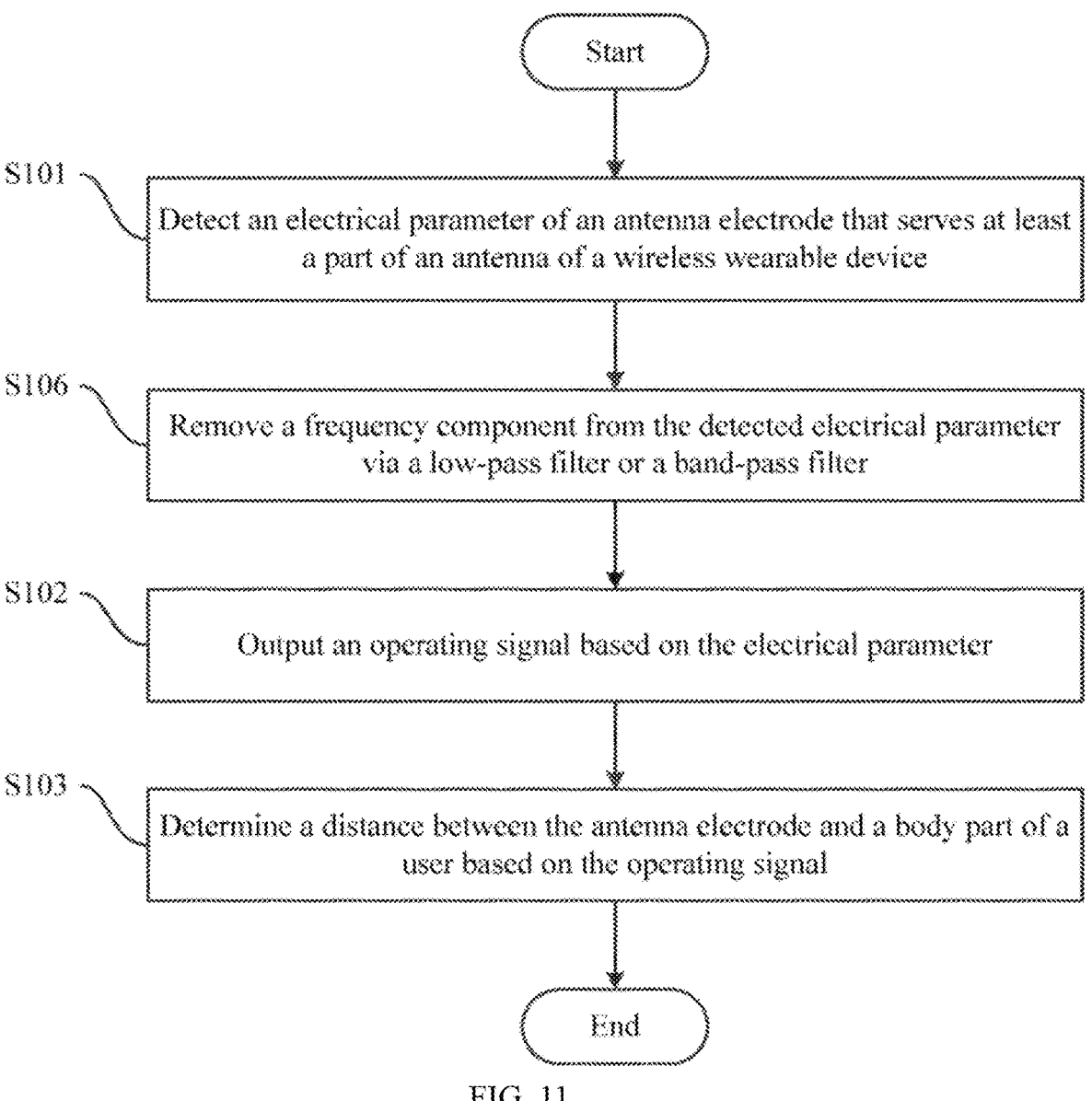
FIG. 11 shows a flowchart of another method for sensing proximity of a wireless device to a body part of a user according to an embodiment of the present disclosure.

Reference is further made to FIG. 11, which shows a flowchart of another method for sensing proximity of a wireless device to a body part of a user according to an embodiment of the present disclosure. In some embodiments, the method includes step S106 before the step S102.

In step S106, a frequency component is removed from the detected electrical parameter via a low-pass filter or a band-pass filter.

The frequency component is a high-frequency component in the electrical parameter. Additionally, a low-frequency component may be removed from a signal transmitted from the antenna electrode to the RF circuitry. Details of the above processes may refer to the foregoing embodiments, and are not repeated herein.

Corresponding to the above case of the electrical parameter reflecting the capacitance, the step S102 includes steps S1021 and S1022 in some embodiments.

In step S1021, the operating signal in a third state is outputted in a case that the capacitance is higher than a threshold capacitance.

In step S1022, the operating signal in a fourth state is outputted in a case that the capacitance is lower than the threshold capacitance.

Details of the third state and the fourth state of the control signal may refer to the foregoing embodiments, and are not repeated herein.

In some embodiments, the electrical parameter reflects a return loss of the antenna.

In some embodiments, the step S102 includes steps S1023 and S1024 when the wireless device performs wireless communication via electromagnetic waves of a first frequency. Alternatively or additionally, the step S102 includes steps S1025 and S1026, when the wireless device performs wireless communication via electromagnetic waves of a second frequency. The first frequency is lower than the second frequency In step S1023, the operating signal in a third state is outputted in a case that the return loss is higher than a first threshold.

In step S1024, the operating signal in a fourth state is outputted in a case that the return loss is lower than a first threshold.

In step S1025, the operating signal in the third state is outputted in a case that the return loss is lower than a second threshold.

In step S1026, the operating signal in the fourth state in a case that the return loss is higher than the second threshold.

Details of the first frequency, the second frequency, and the third state and the fourth state of the control signal may refer to the foregoing embodiments, and are not repeated herein.

Figure 12:
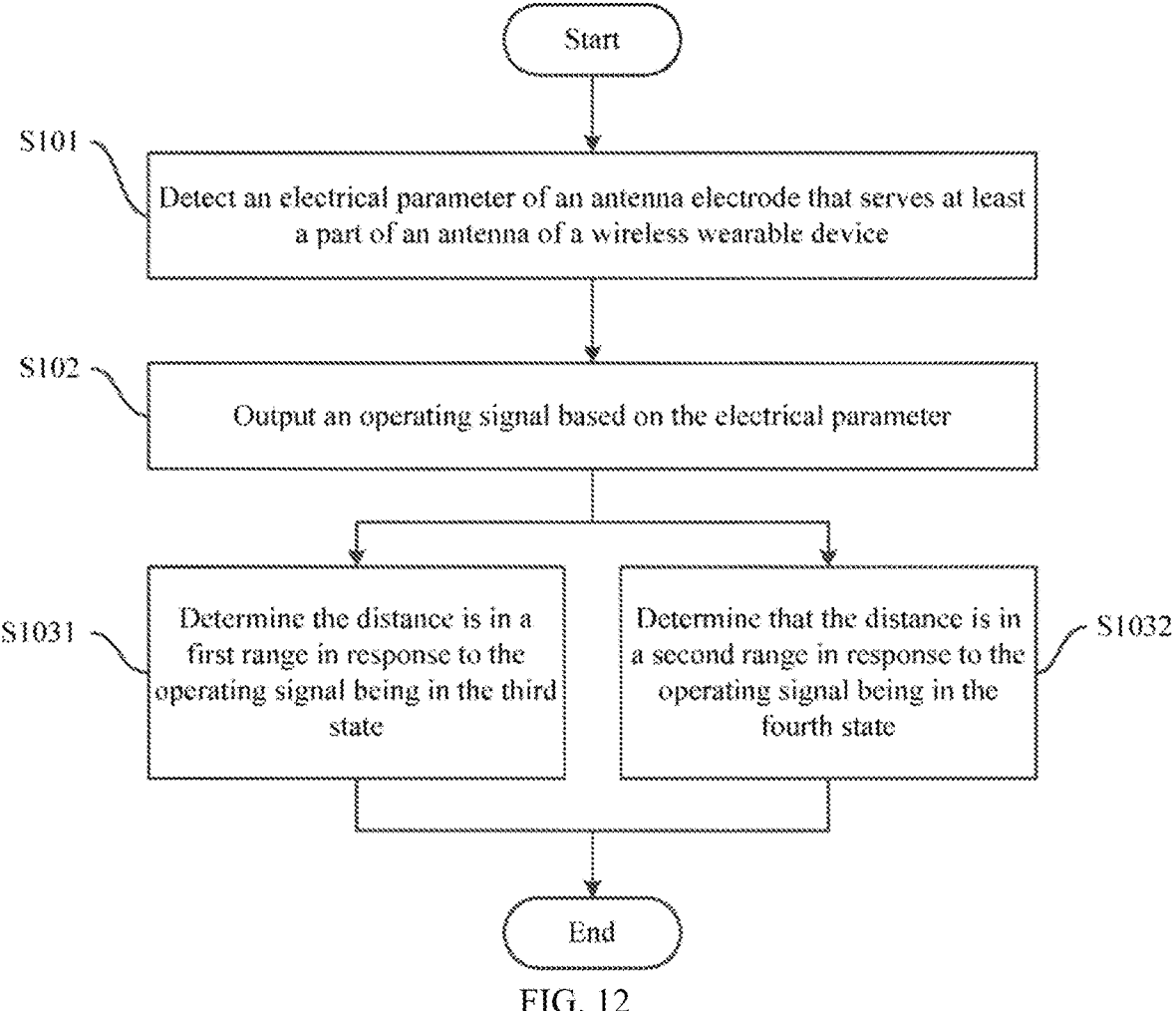
FIG. 12 shows a flowchart of another method for sensing proximity of a wireless device to a body part of a user according to an embodiment of the present disclosure.

Reference is further made to FIG. 12, which shows a flowchart of another method for sensing proximity of a wireless device to a body part of a user according to an embodiment of the present disclosure. In some embodiments, the step S103 includes steps S1031 and S1032.

In step S1031, it is determined that the distance is in a first range in response to the operating signal being in the third state.

In step S1032, it is determined that the distance is in a second range in response to the operating signal being in the fourth state.

Details of the first range and the second range of the distance may refer to the foregoing embodiments, and are not repeated herein.

Reference is further made to FIG. 13, which shows a flowchart of another method for sensing proximity of a wireless device to a body part of a user according to an embodiment of the present disclosure. In some embodiments, the method further includes steps S107 and S108.

In step S107, a first operation of the wireless device is triggered in response to the operating signal being switched from the third state to the fourth state.

In step S108, a second operation of the wireless device is triggered in response to the operating signal being switched from the second state to the first state.

Details of the first operation and the second operation of the wireless device may refer to the foregoing embodiments, and are not repeated herein.

In some embodiments, the first operation is switching the wireless communication from electromagnetic waves of a third frequency to the electromagnetic waves of a fourth frequency. Additionally or alternatively, the second operation is switching the wireless communication from the electromagnetic waves of the fourth frequency to the electromagnetic waves of the third frequency.

Details of the third frequency and the fourth frequency may refer to the foregoing embodiments, and are not repeated herein.

A wireless device is further provided according to embodiments of the present disclosure, in correspondence with the foregoing embodiments concerning the proximity sensor and the method.

In some embodiments, the wireless device includes any foregoing proximity sensor and radio frequency circuitry that is electrically coupled to the proximity sensor.

In some embodiments, the wireless device includes a memory and a processor.

The memory stores instructions, and the instructions when executed by the processor configure the wireless device to perform any forgoing method.

A non-transitory computer-readable medium is further provided according to embodiments of the present disclosure, in correspondence with the foregoing embodiments concerning the proximity sensor, the method, and the wireless device.

The non-transitory computer-readable medium stores instructions, and the instructions when executed by a processor are configured to implement any forgoing method.

The computer readable storage medium includes program instructions, data files, data structure, etc., or a combination thereof. A program recorded in the computer readable storage medium may be programmed or configured to implement the method of the present disclosure. The computer readable storage medium further includes a hardware system for storing and executing the program instructions. The hardware system may be a magnetic medium (such as a hard disk, a floppy disk, and a magnetic tape), or an optical medium (such as a CD-ROM and a DVD), or a magneto-optical medium (such as a floppy optical disk, a ROM, a RAM, and a flash memory, etc.). The program includes assembly language codes or machine codes compiled by a compiler and higher-level language codes interpreted by an interpreter. The hardware system may be implemented with at least one software module to comply with the present disclosure.

The embodiments of the present disclosure are described in a progressive manner, and each embodiment places emphasis on the difference from other embodiments. Therefore, one embodiment can refer to other embodiments for the same or similar parts. Since the method, the wireless device, and the computer-readable medium disclosed in the embodiments corresponds to the proximity sensor disclosed in the embodiments, the description of the method, the wireless device, and the computer-readable medium is simple, and reference may be made to the relevant part of the proximity sensor.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which includes one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more". Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but confirms to a widest scope in accordance with principles and novel features disclosed in the present disclosure.

What is claimed is:

1. A proximity sensor, applied to a wireless device, comprising:

an antenna electrode serving as at least a part of an antenna of the wireless device; and a detecting circuitry electrically coupled to the antenna electrode, wherein the detecting circuitry is configured to detect an electrical parameter of the antenna electrode, and output an operating signal based on the electrical parameter;

wherein a distance between the antenna electrode and a body part of a user is determined based on the operating signal;

wherein the antenna electrode is electrically coupled to radio frequency (RF) circuitry of the wireless device, and the RF circuitry is configured to transmit or receive wireless signals via the antenna;

wherein the electrical parameter reflects capacitance between the antenna electrode and a referential point, and the detecting circuitry comprises capacitance sensing circuitry configured to detect the capacitance;

wherein the operating signal is in a third state in a case that the capacitance is higher than a threshold capacitance, and in a fourth state in a case that the capacitance is lower than the threshold capacitance;

wherein when the wireless device performs wireless communication via electromagnetic waves of a first frequency, the operating signal is in a third state in a case that the return loss is higher than a first threshold, and in a fourth state in a case that the return loss is lower than the first threshold;

when the wireless device performs wireless communication via electromagnetic waves of a second frequency, the operating signal is in the third state in a case that the return loss is lower than a second threshold, and in the fourth state in a case that the return loss is higher than the second threshold; and the first frequency is lower than the second frequency.

2. The proximity sensor according to claim 1, wherein:

the body part serves as another part of the antenna, and a return loss of the antenna is decreased when the distance is decreased for wireless signals of at least one communication standard applicable to the wireless device.

3. The proximity sensor according to claim 1, wherein the RF circuitry and the detecting circuitry are located on a same print circuit board (PCB) of the wireless device.

4. The proximity sensor according to claim 1, wherein the detecting circuitry further comprises switching circuitry and the switching circuitry is configured to switch the antenna electrode between coupling with the RF circuitry and coupling with the capacitance sensing circuitry.

5. The proximity sensor according to claim 4, wherein the switching circuitry is controlled by a control signal, and the switching circuitry is configured to couple the antenna electrode to the RF circuitry in response to the control signal being in a first state, and couple the antenna electrode to the capacitance sensing circuitry in response to the control signal being in a second state.

6. The proximity sensor according to claim 1, wherein the detecting circuitry comprises a first filter electrically coupled between the antenna electrode and the capacitance sensing circuitry, and the first filter is a low-pass filter or a band-pass filter.

7. The proximity sensor according to claim 6, wherein the detecting circuitry further comprises a second filter electrically coupled between the antenna electrode and the RF circuitry, and the second filter is a high-pass filter or a band-pass filter.

8. The proximity sensor according to claim 7, wherein a lower cut-off frequency of the first filter is lower than or equal to an upper cut-off frequency of the second filter.

9. The proximity sensor according to claim 1, wherein the electrical parameter reflects a return loss of the antenna, and the detecting circuitry comprises power sensing circuitry configured to detect the return loss.

10. A wireless device, comprising:

the proximity sensor according to claim 1; and radio frequency circuitry, electrically coupled to the proximity sensor.

11. A method for sensing proximity of a wireless device to a body part of a user, comprising:

detecting an electrical parameter of an antenna electrode that serves at least a part of an antenna of the wireless device;

outputting an operating signal based on the electrical parameter, and determining a distance between the antenna electrode and a body part of a user based on the operating signal;

wherein outputting the operating signal based on the electrical parameter comprises:

outputting the operating signal in a third state in a case that the capacitance is higher than a threshold capacitance, and outputting the operating signal in a fourth state in a case that the capacitance is lower than the threshold capacitance;

wherein when the wireless device performs wireless communication via electromagnetic waves of a first frequency, outputting the operating signal based on the electrical parameter comprises:

outputting the operating signal in a third state in a case that the return loss is higher than a first threshold; and outputting the operating signal in a fourth state in a case that the return loss is lower than a first threshold;

when the wireless device performs wireless communication via electromagnetic waves of a second frequency, outputting the operating signal based on the electrical parameter comprises:

outputting the operating signal in the third state in a case that the return loss is lower than a second threshold; and outputting the operating signal in the fourth state in a case that the return loss is higher than the second threshold; and wherein the first frequency is lower than the second frequency.

12. The method according to claim 11, wherein capacitance detecting circuitry is configured to detect the capacitance, and radio frequency (RF) circuitry is configured to transmit or receive wireless signals via the antenna;

wherein before detecting the electrical parameter of the antenna electrode, the method further comprises:

coupling the antenna electrode electrically to the capacitance detecting circuitry and decoupling the antenna electrode electrically from the RF circuitry, in response to a control signal being in a first state; and wherein the method further comprises:

decoupling the antenna electrode electrically from the capacitance detecting circuitry and coupling the antenna electrode electrically to the RF circuitry, in response to the control signal being in a second state.

13. The method according to claim 11, wherein before outputting the operating signal based on the electrical parameter, the method further comprises:

removing a frequency component from the detected electrical parameter via a low-pass filter or a band-pass filter.

14. The method according to claim 11, wherein determining the distance between the antenna electrode and the body part of the user based on the operating signal comprises:

determining that the distance is in a first range in response to the operating signal being in the third state; and determining that the distance is in a second range in response to the operating signal being in the fourth state; and wherein the first range and the second range do not overlap, and the distance in the first range is smaller than the distance in the second range.

15. A wireless device, comprising:

a processor; and a memory storing instructions, wherein the instructions when executed by the processor configure the wireless device to perform the method according to claim 11.

* * * * *